(12) United States Patent
Kim et al.

(10) Patent No.: US 8,508,194 B2
(45) Date of Patent: Aug. 13, 2013

(54) SEMICONDUCTOR DEVICE

(75) Inventors: Ho-jung Kim, Suwon-si (KR);
Jong-seob Kim, Hwaseong-si (KR);
Jai-kwang Shin, Anyang-si (KR);
Jae-joon Oh, Seongnam-si (KR); Ki-ha Hong, Cheonan-si (KR); In-jun Hwang, Hwaseong-si (KR); Hyuk-soon Choi, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 331 days.

(21) Appl. No.: 12/923,857

(22) Filed: Oct. 12, 2010

(65) Prior Publication Data
US 2011/0221482 A1 Sep. 15, 2011

(30) Foreign Application Priority Data
Mar. 15, 2010 (KR) .................. 10-2010-0022948

(51) Int. Cl.
*G05F 1/10* (2006.01)
(52) U.S. Cl.
USPC .......................... 323/222; 363/71; 327/109
(58) Field of Classification Search
USPC ............. 323/222, 224, 271, 272, 282–290; 363/16, 17, 21.08, 25, 56.05, 87, 98, 132, 363/71; 327/109, 374, 434
See application file for complete search history.

(56) References Cited

U.S. PATENT DOCUMENTS

| | | | |
|---|---|---|---|
| 5,481,194 A | 1/1996 | Schantz et al. | |
| 5,617,306 A * | 4/1997 | Lai et al. | 363/17 |
| 5,767,721 A | 6/1998 | Crampton | |
| 5,959,439 A * | 9/1999 | Shenai et al. | 323/222 |
| 6,969,967 B2 * | 11/2005 | Su | 318/801 |
| 7,030,512 B2 * | 4/2006 | Krein | 307/77 |
| 7,072,194 B2 * | 7/2006 | Nayar et al. | 363/71 |
| 7,672,149 B2 * | 3/2010 | Falk | 363/98 |
| 8,278,934 B2 * | 10/2012 | Wang | 324/509 |

FOREIGN PATENT DOCUMENTS
JP 2008-027407 A 2/2008

* cited by examiner

*Primary Examiner* — Rajnikant Patel
(74) *Attorney, Agent, or Firm* — Harness, Dickey & Pierce, P.L.C.

(57) ABSTRACT

Provided is a semiconductor device that may include a switching device having a negative threshold voltage, and a driving unit between a power terminal and a ground terminal and providing a driving voltage for driving the switching device. The switching device may be connected to a virtual ground node having a virtual ground voltage that is greater than a ground voltage supplied from the ground terminal and may be turned on when a difference between the driving voltage and the virtual ground voltage is greater than the negative threshold voltage.

20 Claims, 6 Drawing Sheets

SEMICONDUCTOR DEVICE

CROSS-REFERENCE TO RELATED APPLICATIONS

This application claims priority under 35 U.S.C. 119 to Korean Patent Application No. 10-2010-0022948, filed on Mar. 15, 2010, in the Korean Intellectual Property Office (KIPO), the entire contents of which are herein incorporated by reference.

BACKGROUND

1. Field

Example embodiments relate to semiconductor devices and power devices, and more particularly, to semiconductor devices and a power devices that each include a switching device.

2. Description of the Related Art

Power devices, which supply power to an apparatus by converting externally-supplied input power into output power having a voltage or current level suitable for the apparatus, have been widely used in portable appliances, for example, portable terminals or laptop computers. In addition, due to the recent development and practical use of environmentally-friendly vehicles, for example, electric vehicles, hybrid vehicles, or fuel cell vehicles, there is an increasing use of power devices in such vehicles to drive a motor of the vehicle.

SUMMARY

Provided are semiconductor devices and a power devices that may efficiently control an ON/OFF of a switching device having a negative threshold voltage without an additional voltage generator for generating a negative voltage.

Provided also are a semiconductor devices and power devices that may efficiently control ON/OFF of a switching device having a positive threshold voltage without an additional boost converter or a charge pump for generating a high voltage.

Additional aspects will be set forth in part in the description which follows and, in part, will be apparent from the description, or may be learned by practice of example embodiments.

In accordance with example embodiments, a semiconductor device may include a switching device having a negative threshold voltage, and a driving unit between a power terminal and a ground terminal and providing a driving voltage for driving the switching device. In example embodiments the switching device may be connected to a virtual ground node having a virtual ground voltage that is greater than a ground voltage supplied from the ground terminal and is turned on when a difference between the driving voltage and the virtual ground voltage is greater than the negative threshold voltage.

In accordance with example embodiments, a semiconductor device may include a switching device having a positive threshold voltage, and a driving unit between a power terminal and a ground terminal and providing a driving voltage for driving the switching device. In example embodiments, the switching device may be connected to a virtual power node having a virtual power voltage that is lower than a power voltage supplied from the power terminal and may be turned off when a difference between the driving voltage and the virtual power voltage is greater than the positive threshold voltage.

In accordance with example embodiments, a power device may include a voltage dividing unit including at least two passive devices which are connected in series between a power terminal and ground terminal, a voltage conversion unit including at least one switching device which is connected to a virtual ground node between the at least two passive devices and has a negative threshold voltage, and providing an output voltage having a different level from a level of the power voltage, and a driving unit connected between the power terminal and the ground terminal and providing a driving voltage for driving the at least one switching device. In example embodiments the switching device may be turned on when a difference between the driving voltage and a voltage of the virtual ground node is greater than the negative threshold voltage.

In accordance with example embodiments, a semiconductor device may include a switching device having a negative threshold voltage and a driving unit disposed between a power terminal and a ground terminal and providing a driving voltage for driving the switching device. The switching device may be connected to a virtual ground node having a virtual ground voltage that is greater than a ground voltage supplied from the ground terminal. The switching device may be turned on when a difference between the driving voltage and the virtual ground voltage is greater than the threshold voltage.

The semiconductor device may further include a voltage dividing unit connected between the power terminal and the ground terminal, wherein the voltage dividing unit may include at least one first passive device connected between the power terminal and the virtual ground node, and at least one second passive device connected between the virtual ground node and the ground terminal.

The virtual ground voltage may have a higher level than that of the threshold voltage. The switching device may include an N-channel transistor having a control terminal to which the driving voltage is applied, and an input terminal connected to the virtual ground node.

The semiconductor device may further include a power unit connected between the power terminal and the ground terminal, wherein the power unit may include a first power source having a negative terminal connected to the ground terminal and at least one second power source connected between a positive terminal of the first power source and the power terminal. The virtual ground node may be connected to a negative terminal of the at least one second power source. The at least one second power source may include a plurality of second power sources, and the virtual ground node may be connected to a negative terminal of one of the plurality of second power sources.

The driving unit may provide a power voltage supplied from the power terminal or the ground voltage supplied from the ground terminal as the driving voltage according to an external control signal. At least one of the first and second passive devices may include a capacitor.

In accordance with example embodiments, a semiconductor device may includes a switching device having a positive threshold voltage, and a driving unit disposed between a power terminal and a ground terminal. The driving unit may provide a driving voltage for driving the switching device, wherein the switching device is connected to a virtual power node having a virtual power voltage that is lower than a power voltage supplied from the power terminal. The switching device may be turned off when a difference between the driving voltage and the virtual power voltage is greater than the threshold voltage.

The virtual power voltage may have a lower level than a difference between the power voltage and the threshold voltage. The switching device may include a P-channel transistor having a control terminal to which the driving voltage is applied, and an input terminal connected to the virtual power node.

In accordance with example embodiments, a power device may include a voltage dividing unit including at least two passive devices which are connected in series between a power terminal and ground terminal, a voltage conversion unit including at least one switching device which is connected to a virtual ground node between the at least two passive devices and has a negative threshold voltage, and providing an output voltage having a different level from a level of the power voltage, and a driving unit connected between the power terminal and the ground terminal and providing a driving voltage for driving the at least one switching device, wherein the switching device is turned on when a difference between the driving voltage and a voltage of the virtual ground node is greater than the threshold voltage.

The voltage of the virtual ground node may be greater than the threshold voltage. The switching device may include an N-channel transistor having a control terminal to which the driving voltage is applied, and an input terminal connected to the virtual ground node.

The power device may further include a power unit connected between the power terminal and the ground terminal, wherein the power unit may include a first power source having a negative terminal connected to the ground terminal, and at least one second power source connected between a positive terminal of the first power source and the power terminal, wherein the virtual ground node is connected to a negative terminal of the at least one second power source.

The voltage conversion unit may include a switching unit including four switching devices which are connected between the power terminal and the virtual ground node and constitute a full-bridge circuit, and a transformer that converts a level of a voltage output from the switching unit to a predetermined or preset level.

The voltage dividing unit may include a first passive device connected between the power terminal and a first node, a second passive device connected between the first node and a second node, a third passive device connected between the second node and a third node, and a fourth passive device connected between the third node and the ground terminal.

The voltage conversion unit may include a first voltage conversion unit including at least one first switching device connected between the power terminal and the first node, and a second voltage conversion unit including at least one second switching device connected between the first node and the third node, wherein a voltage between the first node and the second node has a higher level than a level of a threshold voltage of the at least one switching device, and a voltage of the third node has a higher level than a level of a threshold voltage of the at least one second switching device.

The driving unit may include a first driving unit connected between the power terminal and the second node and providing a first driving voltage for driving the at least one first switching device, and a second driving unit connected between the power terminal and the second node and providing a second driving voltage for driving the at least one second switching device.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
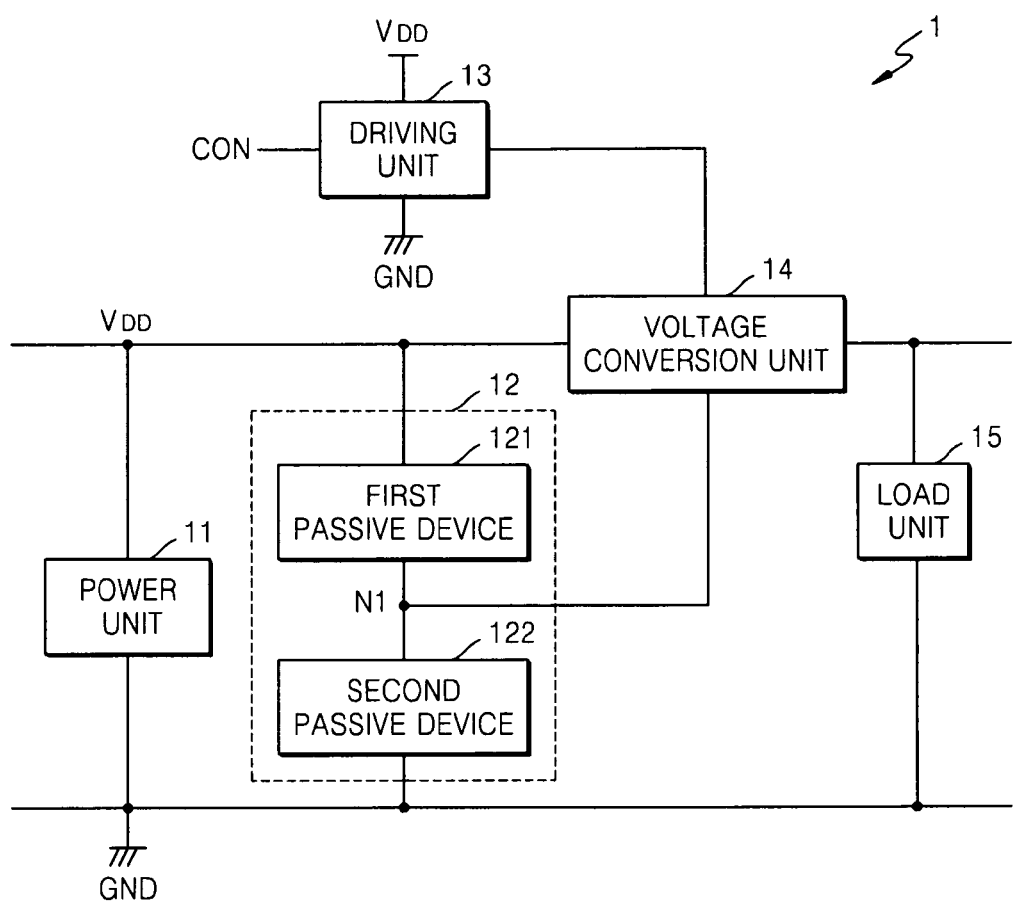
FIG. 1 is a schematic block diagram of a semiconductor device including a switching device having a negative threshold voltage, according to example embodiments.

Example embodiments will now be described more fully with reference to the accompanying drawings. Embodiments, however, may be embodied in many different forms and should not be construed as being limited to the embodiments set forth herein. Rather, example embodiments are provided so that this disclosure will be thorough and complete, and will fully convey the scope to those skilled in the art. In the drawings, the thicknesses of layers and regions are exaggerated for clarity.

It will be understood that when an element is referred to as being "on," "connected to," "electrically connected to," or "coupled to" to another component, it may be directly on, connected to, electrically connected to, or coupled to the other component or intervening components that may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made in detail to example embodiments which are illustrated in the accompanying drawings, wherein like reference numerals refer to the like elements throughout. In this regard, example embodiments may have different forms and should not be construed as being limited to the descriptions set forth herein. Accordingly, example embodiments are merely described below, by referring to the figures, to explain aspects of the present description.

FIG. 1 is a schematic block diagram of a semiconductor device 1 including a switching device having a negative threshold voltage, according to example embodiments.

Referring to FIG. 1, the semiconductor device 1 includes a power unit 11, a voltage dividing unit 12, a driving unit 13, a voltage conversion unit 14, and a load unit 15. The voltage conversion unit 14 may include a switching device having a negative threshold voltage, and a passive device. The voltage conversion unit 14 may convert a power voltage supplied from the power unit 11 to generate a converted voltage. The voltage conversion unit 14 may provide the converted voltage to a load unit 15 according to ON/OFF of the switching device.

The power unit 11 may be connected between a power terminal $V_{DD}$ and a ground terminal GND and may provide a power voltage. The power unit 11 may include a plurality of power sources that may be connected in series. For example, the plurality of power sources may include solar cells (photovoltaic cells). In this case, if sunlight is incident on a solar cell including a semiconductor PN junction, electron-hole pairs may be separated by being excited by the solar energy. An electromotive force may be generated by migration of the electrons and holes, thereby causing an electric current to flow in an external load device connected to the solar cell. However, the power unit 11 is not limited to a solar cell. For example, the power unit 11 may include a battery, for example, a secondary battery.

The voltage dividing unit 12 may include a first passive device 121 and a second passive device 122 that may be connected in series between the power terminal $V_{DD}$ and the ground terminal GND. Although FIG. 1 illustrates that the voltage dividing unit 12 is implemented to include two passive devices, i.e., the first and second passive devices 121 and 122, example embodiments are not limited thereto. For example, the voltage dividing unit 12 may include at least three passive devices. In FIG. 1, the first and second passive devices 121 and 122 may be capacitors. However, example embodiments are not limited thereto. For example, the first and second passive devices 121 and 122 may be resistors or inductors.

In example embodiments, the first passive device 121 may be connected between the power terminal $V_{DD}$ and a first node N1. The second passive device 122 may be connected between the first node N1 and the ground terminal GND. The voltage of the first node N1 may be determined by dividing the power voltage based on impedances of the first passive device 121 and the second passive device 122. Thus, the voltage of the first node N1 may have a higher level than that of the ground voltage supplied from the ground terminal GND and a lower level than that of the power voltage supplied from the power terminal $V_{DD}$. The voltage of the first node N1 may have a higher level than that of the threshold voltage of a switching device of the voltage conversion unit 14. In example embodiments, the first node N1 may be a virtual ground node.

The driving unit 13 may be connected between the power terminal $V_{DD}$ and the ground terminal GND and may provide a driving voltage for driving the switching device of the voltage conversion unit 14. In example embodiments, the driving unit 13 may provide the power voltage or the ground voltage as the driving voltage according to an external control signal CON. For example, the driving unit 13 may be implemented as an inverter in which a PMOS transistor and an NMOS transistor are connected in series. However, the driving unit 13 is not limited to the inverter described above, and may have another suitable structure.

One (first) terminal of the passive device of the voltage conversion unit 14 may be connected to the power terminal $V_{DD}$, and the another (second) terminal of the passive device may be connected to the switching device. The passive device may provide the converted voltage to the switching device. The switching device may be connected between the second terminal of the passive device and the first node N1, and may be turned on or off according to the driving voltage supplied from the driving unit 13. In example embodiments, the switching device may be an N-channel transistor having a negative threshold voltage. For example, the switching device may be implemented using GaN or SiC. As described above, the voltage of the first node N1 may have a higher level than that of the ground voltage. For example, the voltage of the first node N1 may have a higher level than that of the threshold voltage of the switching device. In this case, when a difference between the driving voltage and the voltage of the first node N1 is greater than the threshold voltage of the switching device, the switching device is turned on. This will be described in further detail later.

The load unit 15 may be provided with the converted voltage from the voltage conversion unit 14 according to ON/OFF of the switching device of the voltage conversion unit 14. The load unit 15 may be implemented in various forms.

Figure 2:
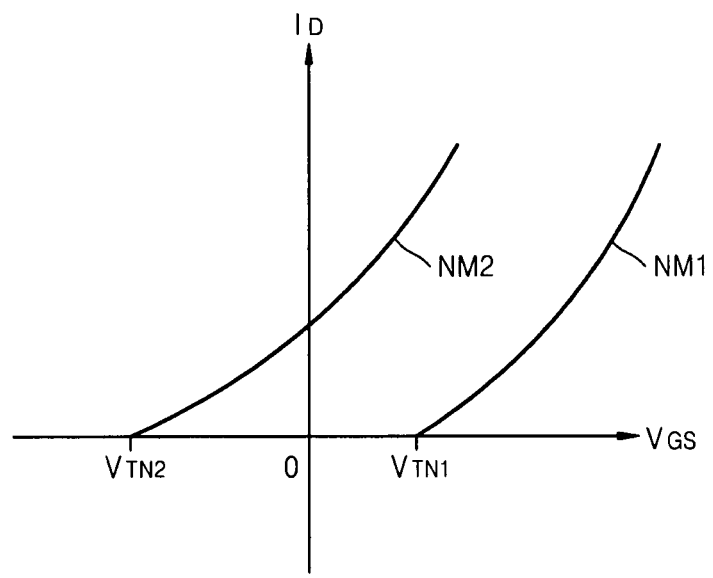
FIG. 2 is a graph of current versus voltage characteristics of N-channel transistors.

FIG. 2 is a graph of current versus voltage characteristics of N-channel transistors.

Referring to FIG. 2, the X-axis represents a voltage ($V_{GS}$) between a gate and a source of an N-channel transistor, and the Y-axis represents a current ($I_D$) at a drain of the N-channel transistor. Reference character NM1 represents current versus voltage characteristics of a first N-channel transistor, and reference character NM2 represents current versus voltage characteristics of a second N-channel transistor.

The first N-channel transistor may be turned on when the voltage ($V_{GS}$) between the gate and the source has a higher level than that of a first threshold voltage ($V_{TN1}$), and may be turned off when the voltage ($V_{GS}$) between the gate and the source has a lower level than that of the first threshold voltage ($V_{TN1}$). The first threshold voltage ($V_{TN1}$) may have a positive level greater than 0. Thus, if the voltage ($V_{GS}$) between the gate and the source is 0V, current may not flow through the drain of the first N-channel transistor. This first N-channel transistor may correspond to an N-channel enhancement-mode transistor.

The second N-channel transistor may be turned on when the voltage ($V_{GS}$) between the gate and the source has a higher level than that of a second threshold voltage ($V_{TN2}$), and may be turned off when the voltage ($V_{GS}$) between the gate and the source has a lower level than that of the second threshold voltage ($V_{TN2}$). The second threshold voltage ($V_{TN2}$) may have a negative level less than 0. Thus, if the voltage ($V_{GS}$) between the gate and the source is 0V, a current may flow through the drain of the second N-channel transistor. This second N-channel transistor may correspond to an N-channel depletion-mode transistor.

For example, when the source of the second N-channel transistor is connected to the ground terminal, and a voltage of 0V is applied to the gate of the second N-channel transistor, the second N-channel transistor may be turned on so that leakage current may occur. Thus, in order for the second N-channel transistor to be turned off, a negative voltage should be applied to the gate of the second N-channel transistor. To this end, a voltage generator for generating a negative voltage may be provided. However, in this case, the total power consumption may be increased, and the entire structure of the semiconductor device may become relatively complicated due to the inclusion of the additional voltage generator, thereby raising costs.

In the example embodiments, referring back to FIG. 1, the switching device of the voltage conversion unit 14 may be an N-channel transistor having a negative threshold voltage, and thus may have current versus voltage characteristics as denoted by 'NM2' in FIG. 2. Thus, if the switching device is connected to the ground terminal GND, a voltage generator for generating a negative voltage may be further required in order to prevent or reduce occurrence of leakage current in the switching device.

However, in example embodiments, the driving unit 13 may be connected between the power terminal $V_{DD}$ and the ground terminal GND, whereas the switching device may be connected between the second terminal of the passive device and the first node N1. Thus, the switching device may be turned on when the difference between the driving voltage and the voltage of the first node N1 is greater than the threshold voltage, and may be turned off when the difference between the driving voltage and the voltage of the first node N1 is smaller than the threshold voltage. In this regard, because the voltage of the first node N1 may have a higher level than that of the ground voltage supplied from the ground terminal GND, the driving voltage may have a lower level than that of the voltage of the first node N1. Thus, the driving unit 13 may control ON/OFF of the switching device, even if not provided with a negative voltage from the voltage generator.

For example, if the power voltage supplied from the power terminal $V_{DD}$ is 5V, the ground voltage supplied from the ground terminal GND is 0V, the voltage of the first node N1 is 2V, and the threshold voltage of the switching device is −1.5V, the driving unit 13 may supply a driving voltage of 5V or 0V according to the control signal CON. If the switching device is connected to the ground terminal GND, the switching device is in an ON-state regardless of a change in the driving voltage supplied from the driving unit 13. However, in the current example, the switching device is connected to the first node N1 having a higher level (for example, 2V) than that of the ground voltage (0V) supplied from the ground terminal GND. Thus, if the driving voltage is 5V, the difference between the driving voltage and the voltage of the first node N1 is 3V, so that the switching device is turned on. If the driving voltage is 0V, the difference between the driving voltage and the voltage of the first node N1 is −2V, so that the switching device is turned off.

Figure 3:
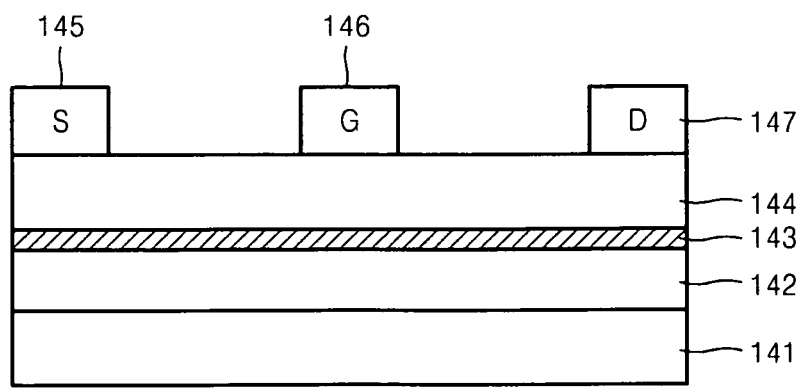
FIG. 3 is a sectional view of an example of a switching device of the semiconductor device of FIG. 1.

FIG. 3 is a sectional view of an example of a switching device of the semiconductor device of FIG. 1.

Referring to FIG. 3, the switching device may be a heterojunction field effect transistor (HFET) or a high electron mobility transistor (HEMT) that each includes a substrate 141, a lower semiconductor layer 142, a channel layer 143, an upper semiconductor layer 144, a source electrode 145, a gate electrode 146, and a drain electrode 147. In example embodiments, the switching device may be an insulated gate bipolar transistor (IGBT).

The substrate 141 may be a semiconductor substrate. For example, the substrate 141 may include a material selected from the group consisting of silicon, sapphire, germanium, silicon-on-insulator, silicon-on-sapphire, and silicon-germanium. A buffer layer (not shown) may be further disposed on the substrate 141.

The source electrode 145, the gate electrode 146 and the drain electrode 147 may be disposed to be separated from each other on the upper semiconductor layer 144. Each of the source electrode 145, the gate electrode 146 and the drain electrode 147 may include a conducting material. A protective layer (not shown) may be further disposed to cover the source electrode 145, the gate electrode 146 and the drain electrode 147.

Each of the lower semiconductor layer 142 and the upper semiconductor layer 144 may include a material having a different bandgap. For example, the lower semiconductor layer 142 may include GaN, GaAs, or InN, and the upper semiconductor layer 144 may include AlGaN, AlGaAs, or AlInN. In this regard, a 2-dimensional electron gas (2-DEG) layer may be derived at the interface between the lower semiconductor layer 142 and the upper semiconductor layer 144 according to a difference between the bandgaps of the lower semiconductor layer 142 and the upper semiconductor layer 144. The 2-DEG layer may work as a channel layer 143.

As such, since the switching device may include the channel layer 143, an electric current may flow through the channel layer 143 when the source electrode 145 is connected to the ground terminal GND, even if a zero voltage is applied to the gate electrode 146. However, in example embodiments, the source electrode 145 may be connected to a terminal having a higher voltage level than that of the ground voltage, for example, a terminal having a higher voltage level than that of the threshold voltage. Thus, an electric current may not flow through the channel layer 143 when a zero voltage is applied to the gate electrode 146.

Figure 4:
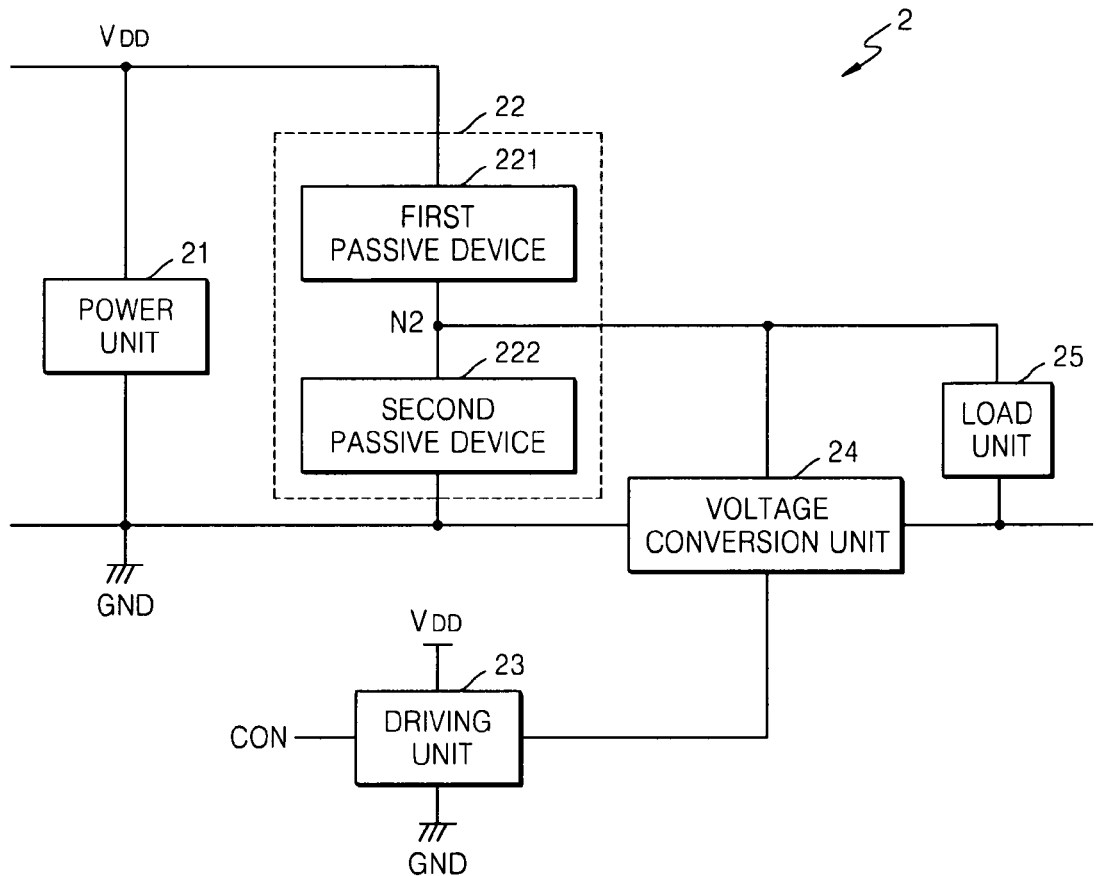
FIG. 4 is a schematic block diagram of a semiconductor device including a switching device having a positive threshold voltage, according to example embodiments.

FIG. 4 is a schematic block diagram of a semiconductor device 2 including a switching device having a positive threshold voltage, according to example embodiments.

Referring to FIG. 4, the semiconductor device 2 may include a power unit 21, a voltage dividing unit 22, a driving unit 23, a voltage conversion unit 24, and a load unit 25. The voltage conversion unit 24 may include a switching device having a positive threshold voltage, and a passive device. The voltage conversion unit 24 may convert a power voltage supplied from the power unit 21 to generate a converted voltage. The voltage conversion unit 24 may provide the converted voltage to the load unit 25 according to ON/OFF of the switching device.

The power unit 21 may be connected between a power terminal $V_{DD}$ and a ground terminal GND and may provide the power voltage. The power unit 21 may have substantially the same structure as the power unit 11 of the semiconductor device 1 of FIG. 1. Thus, a detailed description thereof will not be provided here.

The voltage dividing unit 22 may include a first passive device 221 and a second passive device 222 that are connected in series between the power terminal $V_{DD}$ and the ground terminal GND. Although the voltage dividing unit 22 illustrated in FIG. 4 is implemented to include two passive devices, i.e., the first and second passive devices 221 and 222, example embodiments are not limited thereto. For example, the voltage dividing unit 22 may include at least three passive devices. In example embodiments, the first and second passive devices 221 and 222 may be capacitors. However, example embodiments are not limited thereto. For example, the first and second passive devices 221 and 222 may be resistors or inductors.

In FIG. 4, the first passive device 221 is connected between the power terminal $V_{DD}$ and a second node N2. The second passive device 222 is connected between the second node N2 and the ground terminal GND. The voltage of the second node N2 is determined by dividing the power voltage based on impedances of the first passive device 221 and the second passive device 222. Thus, the voltage of the second node N2 may have a lower level than that of the power voltage supplied from the power terminal $V_{DD}$ and a higher level than that of the ground voltage supplied from the ground terminal GND. The voltage of the second node N2 may have a lower level than that of the threshold voltage of the switching device of the voltage conversion unit 24. In example embodiments, the second node N2 may be a virtual ground node.

The driving unit 23 may be connected between the power terminal $V_{DD}$ and the ground terminal GND and provides a driving voltage for driving the switching device of the voltage conversion unit 24. In particular, the driving unit 23 may provide the power voltage or the ground voltage as the driving voltage according to an external control signal CON. For example, the driving unit 23 may be implemented as an inverter in which a PMOS transistor and an NMOS transistor are connected in series. However, the driving unit 23 is not limited to the inverter described above, and may have another suitable structure.

One (first) terminal of the passive device of the voltage conversion unit 24 may be connected to the ground terminal GND, and another (second) terminal of the passive device may be connected to the switching device. The passive device may provide the converted voltage to the switching device. The switching device may be connected between the second terminal of the passive device and the second node N2, and may be turned on or off according to the driving voltage provided from the driving unit 23. In example embodiments, the switching device may be an P-channel transistor having a positive threshold voltage. As described above, the voltage of the second node N2 may have a lower level than that of the power voltage. For example, the voltage of the second node N2 may have a lower level than a difference between the power voltage and the threshold voltage of the switching device. In this case, when a difference between the driving voltage and the voltage of the second node N2 is greater than the threshold voltage of the switching device, the switching device is turned off. This will be described in further detail later.

The load unit 25 may be provided with the converted voltage from the voltage conversion unit 24 according to ON/OFF of the switching device of the voltage conversion unit 24. The load unit 25 may be implemented in various forms.

Figure 5:
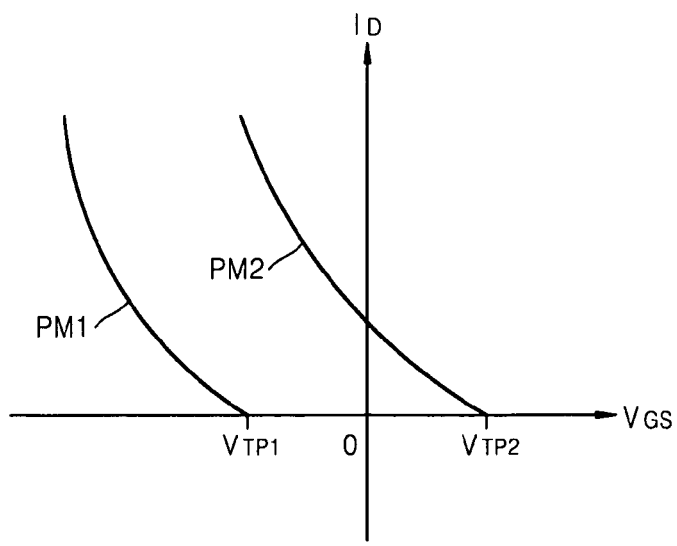
FIG. 5 is a graph of current versus voltage characteristics of P-channel transistors.

FIG. 5 is a graph of current versus voltage characteristics of P-channel transistors.

Referring to FIG. 5, the X-axis represents a voltage ($V_{GS}$) between a gate and a source of a P-channel transistor, and the Y-axis represents a current ($I_D$) at a drain of the P-channel transistor. Reference character PM1 represents current versus voltage characteristics of a first P-channel transistor, and reference character PM2 represents current versus voltage characteristics of a second P-channel transistor.

A first P-channel transistor may be turned off when the voltage ($V_{GS}$) between the gate and the source has a higher level than that of a first threshold voltage ($V_{TP1}$), and may be turned on when the voltage ($V_{GS}$) between the gate and the source has a lower level than the first threshold voltage ($V_{TP1}$). The first threshold voltage ($V_{TP1}$) may have a negative level less than 0. Thus, if the voltage ($V_{GS}$) between the gate and the source is 0V, current may not flow through the drain of the first P-channel transistor. This first P-channel transistor may correspond to a P-channel enhancement-mode transistor.

The second P-channel transistor may be turned off when the voltage ($V_{GS}$) between the gate and the source has a higher level than that of a second threshold voltage ($V_{TP2}$), and may be turned on when the voltage ($V_{GS}$) between the gate and the source has a lower level than that of the second threshold voltage ($V_{TP2}$). The second threshold voltage ($V_{TP2}$) may have a positive value greater than 0. Thus, if the voltage ($V_{GS}$) between the gate and the source is 0V, an electric current may flow through the drain of the second P-channel transistor. This second P-channel transistor may correspond to a P-channel depletion-mode transistor.

For example, when the source of the second P-channel transistor is connected to the power terminal, and the power voltage is applied to the gate of the second P-channel transistor, the voltage between the gate and the source of the second P-channel transistor becomes 0V, and the second N-channel transistor may be turned on, so that leakage current may occur. Thus, in order for the second P-channel transistor to be turned off, a higher voltage than the power voltage should be applied to the gate of the second P-channel transistor. To this end, a booster circuit or a charge pump may further be required. However, in this case, the total power consumption may be increased, and the entire structure of the semiconductor device may become relatively complicated due to the inclusion of the additional booster circuit or charge pump, thereby raising costs.

In example embodiments, referring back to FIG. 4, the switching device of the voltage conversion unit 24 may be a P-channel transistor having a positive threshold voltage, and thus may have current versus voltage characteristics as denoted by 'PM2' in FIG. 5. Thus, if the switching device is connected to the power terminal $V_{DD}$, an additional element, for example, a booster circuit, may be further required in order to prevent or reduce occurrence of leakage current in the switching device.

However, in example embodiments, the driving unit 23 may be connected between the power terminal $V_{DD}$ and the ground terminal GND, whereas the switching device may be connected between the second terminal of the passive device and second node N2. Thus, the switching device may be turned off when the difference between the driving voltage and the voltage of the second node N2 is greater than the threshold voltage, and may be turned off if the difference between the driving voltage and the voltage of the second node N2 is smaller than the threshold voltage. In this regard, because the voltage of the second node N2 has a lower level than that of the power voltage supplied from the power terminal $V_{DD}$, the driving voltage may have a higher level than that of the voltage of the second node N2. Thus, the driving unit 23 may control ON/OFF of the switching device, even if not provided with a voltage from the boost circuit that generates a higher voltage than the power voltage.

For example, if the power voltage supplied from the power terminal $V_{DD}$ is 5V, the ground voltage supplied from the ground terminal GND is 0V, the voltage of the second node N2 is 2V, and the threshold voltage of the switching device is 1.5 V, the driving unit 23 may supply a driving voltage of 5V or 0V according to the control signal CON. If the switching device is connected to the power terminal $V_{DD}$, the switching device is in an ON-state regardless of a change in the driving voltage supplied from the driving unit 23. However, in example embodiments, the switching device may be connected to the second node N2 having a lower level (for example, 2V) than that of the power voltage (5 V) supplied from the power terminal $V_{DD}$. Thus, if the driving voltage is 5V, the difference between the driving voltage and the voltage of the second node N2 is 3V, so that the switching device may be turned off. If the driving voltage is 0V, the difference between the driving voltage and the voltage of the second node N2 is −2V, so that the switching device may be turned on.

Figure 6:
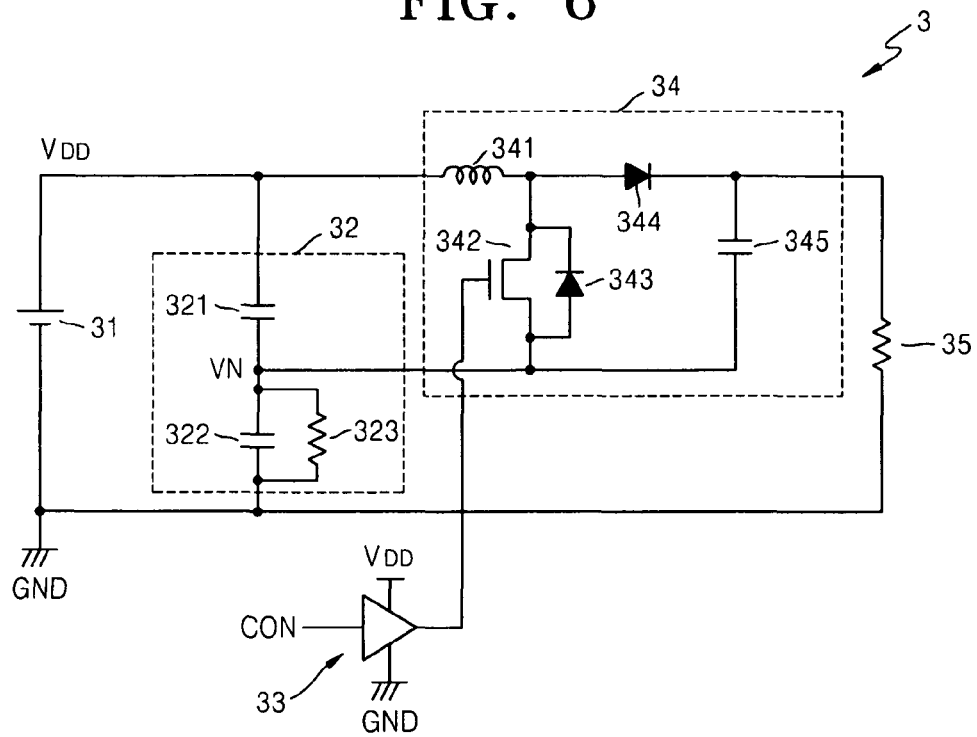
FIG. 6 is a schematic circuit diagram of a power device including a switching device having a negative threshold voltage, according to example embodiments.

FIG. 6 is a schematic circuit diagram of a power device 3 including a switching device having a negative threshold voltage, according to example embodiments.

Referring to FIG. 6, the power device 3 may include a power unit 31, a voltage dividing unit 32, a driving unit 33, a voltage conversion unit 34, and a load unit 35. In example embodiments, the voltage conversion unit 34 may be a boost converter that boosts a voltage supplied from the power unit 31 to a boost voltage and supplies the boost voltage to the load unit 35. In this regard, the voltage conversion unit 34 may include an inductor 341, a switching device 342, a first diode 343, a second diode 344, and a capacitor 345. However, aspects of example embodiments are not limited thereto. For example, the voltage conversion unit 34 may be a buck converter.

The power unit 31 may be connected between a power terminal $V_{DD}$ and a ground terminal GND and may provide the power voltage. The power unit 31 may have substantially the same structure as the power unit 11 of the semiconductor device 1 of FIG. 1. Thus, a detailed description thereof will not be provided here.

The voltage dividing unit 32 may include a first capacitor 321, a second capacitor 322, and a resistor 323 connected in parallel to the second capacitor 323. In this regard, a noise component may be removed from the power voltage by the first capacitor 321 and the second capacitor 322. Although the voltage dividing unit 32 illustrated in FIG. 6 is implemented to include two capacitors, i.e., the first and second capacitors 321 and 322, example embodiments are not limited thereto. For example, the voltage dividing unit 32 may include at least three capacitors. Alternatively, the voltage dividing unit 32 may include at least two among resistors, inductors, capacitors, or a combination thereof.

In particular, the first capacitor 321 may be connected between the power terminal $V_{DD}$ and a virtual ground node VN. The second capacitor 322 may be connected between the virtual ground node VN and the ground terminal GND. The voltage of the virtual ground node VN may be determined by dividing the power voltage based on capacitances, e.g., impedances, of the first capacitor 321 and the second capacitor 322. Thus, the voltage of the virtual ground node VN may have a higher level than that of the ground voltage supplied from the ground terminal GND and a lower level than that of the power voltage supplied from the power terminal $V_{DD}$. In this regard, because the voltage of the virtual ground node VN should be higher than the threshold voltage of the switching device 342, the capacitances of the first capacitor 321 and the second capacitor 322 may be determined based on the threshold voltage of the switching device 342.

The driving unit 33 is connected between the power terminal $V_{DD}$ and the ground terminal GND and provides a driving voltage for driving the switching device 342. In particular, the driving unit 33 may provide the power voltage or the ground voltage as the driving voltage according to an external control signal CON. In this case, the driving voltage may be provided as a pulse width modulation (PWM) signal whose duty ratio is adjusted according to the control signal CON. Hereinafter, the driving signal provided as a PWM signal will be referred to as a driving signal. For example, the driving unit 33 may be implemented as an inverter in which a PMOS transistor and an NMOS transistor are connected in series. However, the driving unit 33 is not limited to the inverter described above, and may have any structure.

The voltage conversion unit 34 may include an inductor 341, a switching device 342, a first diode 343, a second diode 344, and a capacitor 345. The voltage conversion unit 34 may convert the power voltage supplied from the power terminal $V_{DD}$ to generate a boost voltage. In particular, an ON/OFF time duration of the switching device 342 may be varied according to the duty ratio of the driving signal supplied from the driving unit 33. The capacitor 345 may be charged while the switching device 342 is turned on, and may be discharged while the switching device 342 is turned off. Thus, the capacitor 345 may provide a boost output voltage to the load unit 35. In this regard, the control signal CON may vary according to a degree to which the load unit 35 is discharged, and thus, the duty ratio of the driving signal may be adaptively adjusted according to the control signal CON.

One (first) terminal of the inductor 341 may be connected to the power terminal $V_{DD}$ and the other (second) terminal of the inductor 341 may be connected to one (first) terminal of the second diode 344. The other (second) terminal of the second diode 344 may be connected to one (first) terminal of the capacitor 345. The other (second) terminal of the capacitor 345 may be connected to the virtual ground node VN. The switching device 342 may be connected between the second terminal of the inductor 341 and the virtual ground node VN. The first diode 343 may be connected in parallel in a reverse direction to the switching device 342. The first diode 343 may be a parasitic diode to the switching device 342. The switching device 342 and the first diode 343 may constitute a power switching device.

In example embodiments, the switching device 342 may be an N-channel transistor having a negative threshold voltage. In particular, the switching device 342 may have a drain connected to the second terminal of the inductor 341, a gate to which the driving voltage is applied from the driving unit 33, and a source connected to the virtual ground node VN. The gate may correspond to a control terminal, and one of the drain and the source may correspond to an input terminal. The switching device 342 may be turned on when a difference between the driving voltage applied to the gate and a virtual ground voltage applied to the source is greater than the threshold voltage. In other words, the switching device 342 may be turned off when the difference between the driving voltage and the virtual ground voltage is smaller than the threshold voltage.

For example, if the power voltage supplied from the power terminal $V_{DD}$ is 5V, the ground voltage supplied from the ground terminal GND is 0V, the virtual ground voltage of the virtual ground node VN is 2V, and the threshold voltage of the switching device 242 is −1.5V, the driving unit 33 may supply a driving voltage of 5V or 0V according to the control signal CON. For example, if the driving voltage is 5V, the difference between the driving voltage and the virtual ground voltage is 3V, so that the switching device 342 is turned on. If the driving voltage is 0V, the difference between the driving voltage and the virtual ground voltage is −2V, so that the switching device 342 is turned off. Thus, leakage current may not occur or may be minimized in the switching device 342 when the driving voltage is 0V.

As described above, according example embodiments as illustrated in FIG. 6, ON/OFF of the switching device 342 may be controlled even if the driving voltage does not have a negative level. Thus, an additional voltage generator for generating a negative voltage may not need to be required, thereby reducing or minimizing a complexity of circuit configuration and power consumption.

Figure 7:
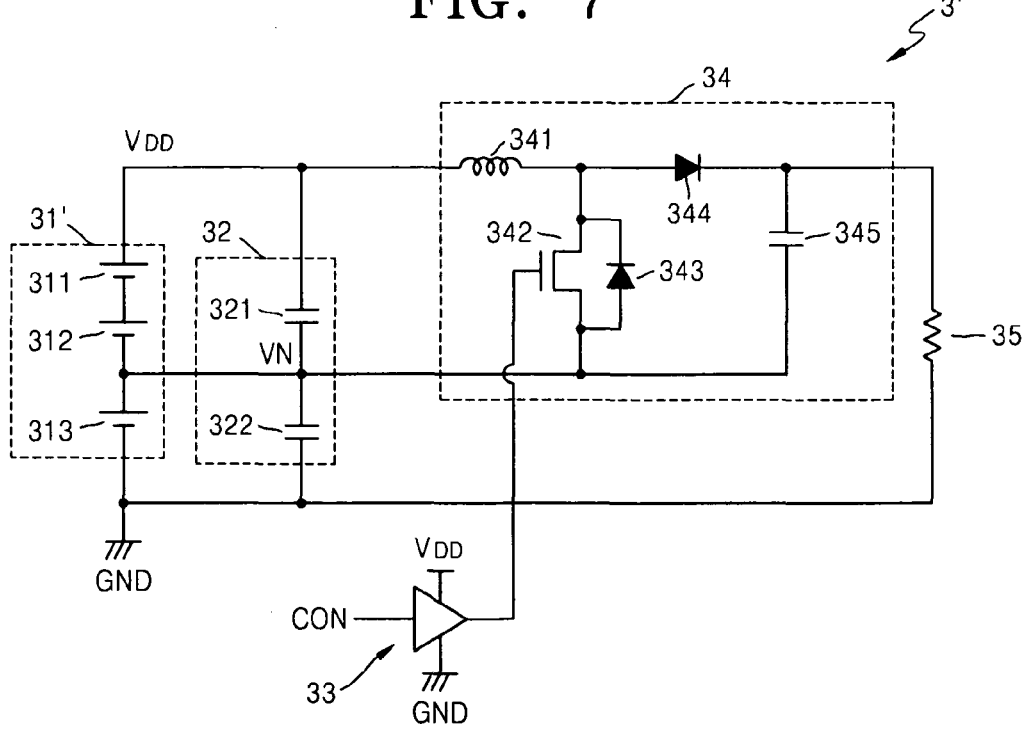
FIG. 7 is a circuit diagram of a power device including a switching device having a negative threshold voltage, according to example embodiments.

FIG. 7 is a circuit diagram of a power device 3' including a switching device 342 having a negative threshold voltage, according to example embodiments.

Referring to FIG. 7, the power device 3' may include a power unit 31', a voltage dividing unit 32, a driving unit 33, a voltage conversion unit 34, and a load unit 35. The power device 3' according to example embodiments is a partial modification from the power device 3 of FIG. 6. Thus, a detailed description thereof will not be provided here.

The power unit 31' may be connected between a power terminal $V_{DD}$ and a ground terminal GND and may provide the power voltage. The power unit 31' may include a plurality of first to third power sources 311, 312, and 313. In particular, the first power source 311 may have a positive terminal connected to the power terminal $V_{DD}$, the second power source 312 may have a positive terminal connected to a negative terminal of the first power source 311, and the third power source 313 may have a positive terminal connected to a negative terminal of the second power source 312 and a negative terminal connected to the ground terminal GND. Thus, the negative terminals of the first power source 311 and the second power source 312 may have a higher voltage than that of the voltage of the ground terminal GND.

Although the power unit 31' illustrated in FIG. 7 is implemented to include three power sources, example embodiments are not limited thereto. For example, the power unit 31' may include at least two or at least four power sources. Each of the power sources may be implemented as a solar cell or a general secondary battery.

The voltage dividing unit 32 may include a first capacitor 321 and a second capacitor 322 that are connected in series between the power terminal $V_{DD}$ and the ground terminal GND. In particular, the first capacitor 321 may be connected between the power terminal $V_{DD}$ and a virtual ground node VN. The second capacitor 322 may be connected between the virtual ground node VN and the ground terminal GND. The virtual ground node VN may be connected to the negative terminal of the second power source 312. Alternatively, the virtual ground node VN may be connected to the negative terminal of the first power source 311.

The voltage conversion unit 34 may include an inductor 341, a switching device 342, a first diode 343, a second diode 344, and a capacitor 345. In example embodiments, the switching device 342 may be an N-channel transistor having a negative threshold voltage. In particular, the switching device 342 may have a drain connected to a terminal of the inductor 341, a gate to which a driving voltage is applied from the driving unit 33, and a source connected to a virtual ground node VN, i.e., a negative terminal of the second power source 312. The negative terminal of the second power source 312 may have a higher voltage than the threshold voltage of the switching device 342. In example embodiments, the source of the switching device 342 may be connected to the negative terminal of the first power source 311. In this regard, the negative terminal of the first power source 311 may have a higher voltage level than that of the threshold voltage of the switching device 342. Alternatively, the source of the switching device 342 may be connected to the negative terminal of the first power source 311 or the second power source 312, not to the virtual ground node VN.

In example embodiments, the switching device 342 may be turned on when a difference between a driving voltage applied to the gate and a virtual ground voltage applied to the source is greater than the threshold voltage. Or, in other words, the switching device 342 may be turned off when the difference between the driving voltage and the virtual ground voltage is smaller than the threshold voltage. As described above, according to example embodiments, ON/OFF of the switching device 342 may be controlled even if the driving voltage does not have a negative level. Thus, an additional voltage generator for generating a negative voltage may not be required, thereby reducing or minimizing a complexity of circuit configuration and power consumption.

Figure 8:
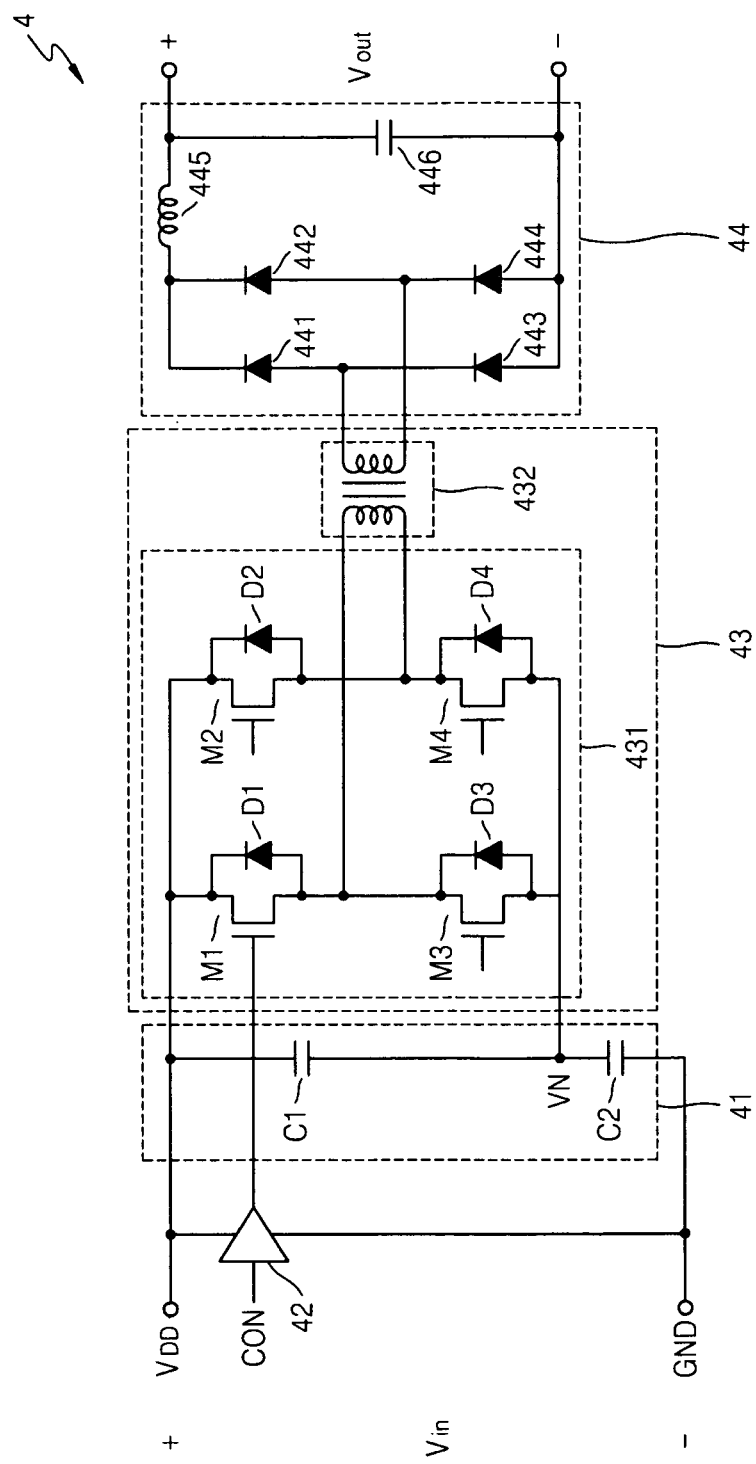
FIG. 8 is a circuit diagram of a power device including a switching device having a negative threshold voltage, according to example embodiments.

FIG. 8 is a circuit diagram of a power device 4 including a switching device having a negative threshold voltage, according to example embodiments.

Referring to FIG. 8, the power device 4 may include a voltage dividing unit 41, a driving unit 42, a voltage conversion unit 43, and a rectifying unit 44. The voltage conversion unit 43 may include a switching unit 431 and a transformer unit 432. In example embodiments, the voltage conversion unit 43 may be a DC-DC converter for converting a level of a direct-current (DC) voltage to another level. The power device 4 may be used in an electric vehicle or a hybrid electric vehicle.

The voltage dividing unit 41 may include a first capacitor C1 and a second capacitor C2 that may be connected in series between the power terminal $V_{DD}$ and the ground terminal GND. The voltage difference between the power terminal $V_{DD}$ and the ground terminal GND is equivalent to an input voltage $V_{in}$. Although the voltage dividing unit 41 illustrated in FIG. 8 is implemented to include two capacitors, i.e., the first and second capacitors C1 and C2, example embodiments are not limited thereto. For example, the voltage dividing unit 41 may include at least three capacitors. Alternatively, the voltage dividing unit 41 may include at least two among resistors, inductors, and capacitors, or a combination thereof.

In particular, the first capacitor C1 may be connected between the power terminal $V_{DD}$ and a virtual ground node VN. The second capacitor C2 may be connected between the virtual ground node VN and the ground terminal GND. The voltage of the virtual ground node VN may be determined by dividing the power voltage based on capacitances, e.g., impedances, of the first capacitor C1 and the second capacitor C2. Thus, the voltage of the virtual ground node VN may have a higher level than that of the ground voltage supplied from the ground terminal GND and a lower level than that of the power voltage supplied from the power terminal $V_{DD}$. In this regard, because the voltage of the virtual ground node VN should be higher than the threshold voltages of first through fourth switching devices M1, M2, M3 and M4 of the switching unit 431, the capacitances of the first capacitor C1 and the second capacitor C2 may be determined based on the threshold voltages of the first through fourth switching devices M1, M2, M3 and M4.

The driving unit 42 may be connected between the power terminal $V_{DD}$ and the ground terminal GND and may provide a driving voltage for driving the first switching device M1 of the switching unit 431. Although only one driving unit 42 for the first switching device M1 is illustrated in FIG. 8 for convenience of explanation, the power device 4 may include four driving units for the respective first through fourth switching devices M1, M2, M3, and M4. In example embodiments, the power device 4 may include two driving units. In example embodiments, the first and fourth switching devices M1 and M4 may be connected in common to one of the driving units, and the second and third switching devices M2 and M3 may be connected in common to the other driving unit.

In particular, the driving unit 42 may provide the power voltage or the ground voltage as the driving voltage according to an external control signal CON. In example embodiments, the driving voltage may be provided as a pulse width modulation (PWM) signal whose duty ratio may be adjusted according to the control signal CON. For example, the driving unit 42 may be implemented as an inverter in which a PMOS transistor and an NMOS transistor are connected in series. However, the driving unit 42 is not limited to the inverter described above, may have any structure.

As described above, the voltage conversion unit 43 may include the switching unit 431 and the transformer unit 432. The switching unit 431 may include the first through fourth switching devices M1, M2, M3, and M4, and first through fourth diodes D1, D2, D3, and D4. The switching unit 431 may be referred to as a power module. The first diode D1 may be connected in parallel to the first switching device M1 in a reverse direction, the second diode D2 may be connected in parallel to the second switching device M2 in a reverse direction, the third diode D3 may be connected in parallel to the third switching device M3 in a reverse direction, and the fourth diode D4 may be connected in parallel to the fourth switching device M4 in a reverse direction. The first through fourth diodes D1, D2, D3, and D4 may be parasitic diodes to the respective first through fourth switching devices M1, M2, M3, and M4.

The first through fourth switching devices M1, M2, M3 and M4 may be implemented in a full-bridge mode in which the first and fourth switching devices M1 and M4 are simultaneously turned on or off, and the second and third switching devices M2 and M3 are turned on or off, alternately with the first and fourth switching devices M1 and M4, respectively. In particular, while the first and fourth switching device M1 and M4 are simultaneously turned on, the second and third switching devices M2 and M3 may be simultaneously turned off. Thus, a current flow path connecting the power terminal $V_{DD}$, the first switching device M1, the transformer unit 432, the fourth switching device M4 and the ground terminal GND may be formed. On the other hand, while the second and third switching devices M2 and M3 are simultaneously turned on, the first and fourth switching devices M1 and M4 may be simultaneously turned off. Thus, a current flow path connecting the power terminal $V_{DD}$, the second switching device M2, the transformer unit 432, the third switching device M3 and the ground terminal GND may be formed.

In example embodiments, the first through fourth switching devices M1, M2, M3 and M4 may be N-channel transistors each having a negative threshold voltage. In example embodiments, the first switching device M1 may have a drain connected to the power terminal $V_{DD}$ and a gate to which the driving voltage is applied. The second switching device M2 may have a drain connected to the power terminal $V_{DD}$ and a gate to which the driving voltage is applied. The third switching device M3 may have a drain connected to a source of the first switching device M1, a gate to which the driving voltage is applied, and a source connected to the virtual ground node VN. The fourth switching device M4 may have a drain connected to a source of the second switching device M2, a gate to which the driving voltage is applied, and a source connected to the virtual ground node VN.

Since the switching unit 431 may be connected between the power terminal $V_{DD}$ and the virtual ground node VN, each of the first through fourth switching devices M1, M2, M3, and M4 may be turned on when a difference between the driving voltage and the virtual ground voltage of the virtual ground node VN is greater than the threshold voltage, and may be turned off when the difference between the driving voltage and the virtual ground voltage of the virtual ground node VN is smaller than the threshold voltage. Thus, leakage current is minimized or does not occur in the first through fourth switching devices M1, M2, M3, and M4 even when the driving voltage is 0V.

The transformer unit 432 may convert the level of the power voltage switched by the switching unit 431 to a level that may or may not be predetermined. In particular, the transformer unit 432 may include a transformer including a primary wire and a secondary wire. A winding ratio between the primary wire and the second wire may be determined according to the voltage level conversion rate. In example embodiments, the transformer unit 432 may further include an inductor or a capacitor between the switching unit 431 and the primary wire.

The rectifying unit 44 may rectify a converted voltage supplied from the voltage conversion unit 43 to generate an output voltage $V_{out}$. In particular, the rectifying unit 44 may include four diodes 441, 442, 443, and 444, an inductor 445 and a capacitor 446. The four diodes 441, 442, 443, and 444 constitute a bridge diode circuit that full-wave rectifies the converted voltage supplied from the voltage conversion unit 43. The inductor 445 and the capacitor 446 constitute a low-pass filter that may perform low-pass filtering with respect to an output from the bridge diode circuit to provide a DC component with a minimal ripple as the output voltage $V_{out}$.

Figure 9:
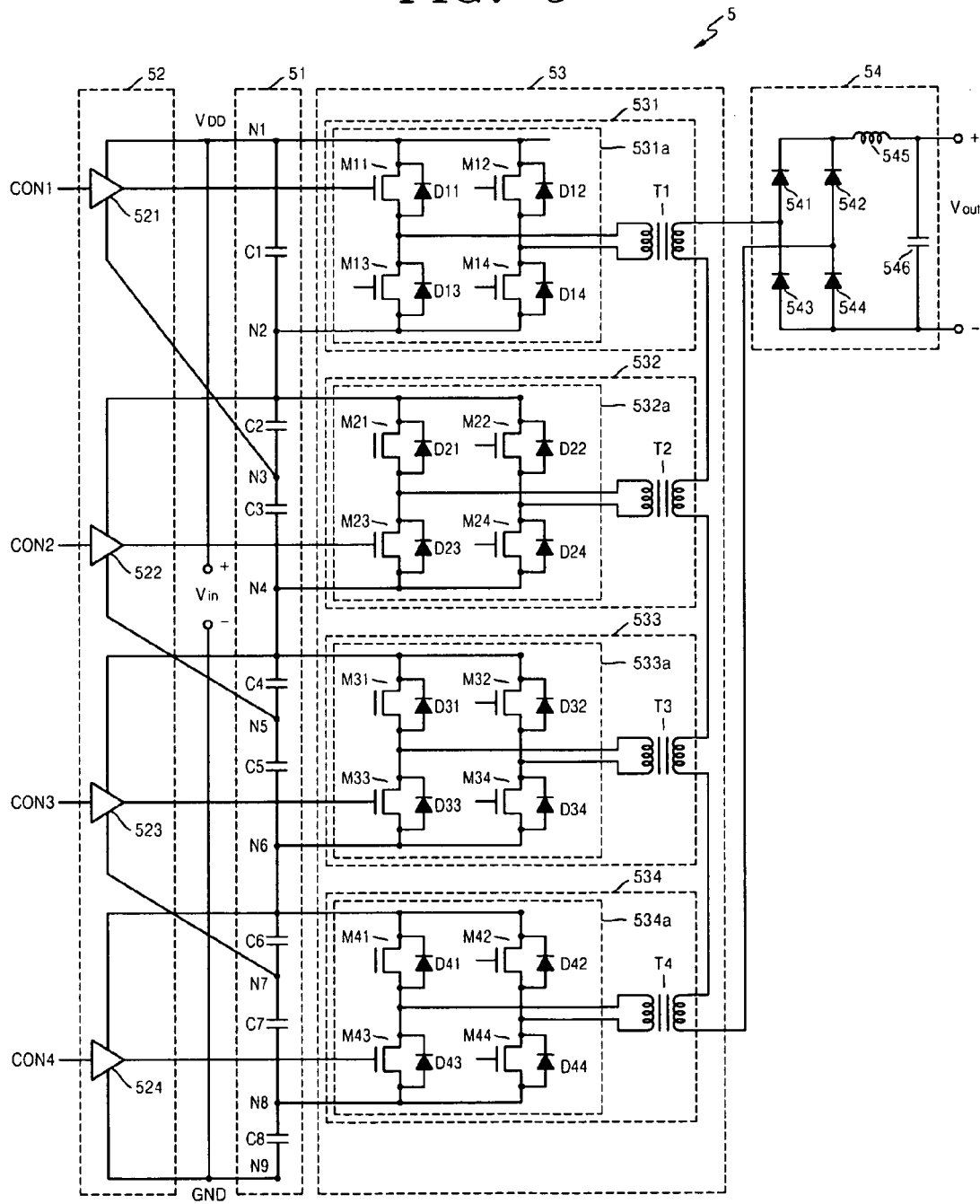
FIG. 9 is a circuit diagram of a power device including a switching device having a negative threshold voltage, according to example embodiments.

FIG. 9 is a circuit diagram of a power device 5 including a switching device having a negative threshold voltage, according to example embodiments.

Referring to FIG. 9, the power device 5 may include a voltage dividing unit 51, a driving unit 52, a voltage conversion unit 53, and a rectifying unit 54. The voltage conversion unit 53 may include first through fourth voltage converters 531, 532, 533 and 534 that are connected in series. The power device 5 is a modification of the power device 4 of FIG. 8. Thus, a detailed description thereof will not be provided here.

The voltage dividing unit 51 may include first through eighth capacitors C1 through C8 connected in series between the power terminal $V_{DD}$ and the ground terminal GND. The voltage difference between the power terminal $V_{DD}$ and the ground terminal GND is equivalent to an input voltage $V_{in}$. Although FIG. 9 illustrates the voltage dividing unit 51 as being implemented to include eight capacitors, i.e., the first through eighth capacitors C1 through C8, example embodiments are not limited thereto. For example, the voltage dividing unit 51 may include at least nine capacitors. Alternatively, the voltage dividing unit 51 may include a resistor, an inductor, a capacitor, or a combination thereof.

In example embodiments, the first capacitor C1 may be connected between a first node N1, which corresponds to the power terminal $V_{DD}$, and a second node N2. The second capacitor C2 may be connected between the second node N2 and a third node N3. The third capacitor C3 may be connected between the third node N3 and a fourth node N4. The fourth capacitor C4 may be connected between the fourth node N4 and a fifth node N5. The fifth capacitor C5 may be connected between the fifth node N5 and a sixth node N6. The sixth capacitor C6 may be connected between the sixth node N6 and a seventh node N7. The seventh capacitor C7 may be connected between the seventh node N7 and an eighth node N8. The eighth capacitor C8 may be connected between the eighth node N8 and a ninth node N9.

The voltage between the second node N2 and the third node N3, i.e., the voltage of the second capacitor C2, may be greater than the threshold voltages of switching devices M11, M12, M13, and M14 of a first switching unit 531a. The voltage between the fourth node N4 and the fifth node N5, i.e., the voltage of the fourth capacitor C4, may be greater than the threshold voltages of switching devices M21, M22, M23, and M24 of a second switching unit 532a. The voltage between the sixth node N6 and the seventh node N7, i.e., the voltage of the sixth capacitor C6, may be greater than the threshold voltages of switching devices M31, M32, M33, and M34 of a third switching unit 533a. The voltage between the eighth node N8 and the ninth node N9, i.e., the voltage of the eighth capacitor C8, may be greater than the threshold voltages of switching devices M41, M42, M43, and M44 of a fourth switching unit 534a. Thus, the capacitances of the first through eighth capacitors C1 through C8 may be determined based on the threshold voltages of the switching devices of the corresponding first to fourth switching units 531a, 532a, 533a, and 534a.

The driving unit 52 may include first through fourth driving units 521, 522, 523, and 534. The first driving unit 521 may be connected between the first node N1 and the third node N3 and may provide a driving voltage for driving the switching device M11 of the first switching unit 531a. The second driving unit 522 may be connected between the second node N2 and the fifth node N5 and may provide a driving voltage for driving the switching device M23 of the second switching unit 523a. The third driving unit 523 may be connected between the fourth node N4 and the seventh node N7 and may provide a driving voltage for driving the switching device M33 of the third switching unit 533a. The fourth driving unit 524 may be connected between the sixth node N6 and the ninth node N9 and may provide a driving voltage for driving the switching device M43 of the fourth switching unit 534a.

In example embodiments, the first driving unit 521 may provide the power voltage or the voltage of the third node N3 as the driving voltage according to an external first control signal CON1. The second driving unit 522 may provide the voltage of the second node N2 or the voltage of the fifth node N5 as the driving voltage according to an external second control signal CON2. The third driving unit 523 may provide the voltage of the fourth node N4 or the voltage of the seventh node N7 as the driving voltage according to an external third control signal CON3. The fourth driving unit 524 may provide the voltage of the sixth node N6 or the voltage of the ninth node N9 as the driving voltage as an external fourth control signal CON4. Each of the driving voltages may be provided as a pulse width modulation (PWM) signal whose duty ratio may be adjusted according to the corresponding control signal. For example, each of the first through fourth driving units 521, 522, 523, and 524 may be implemented as an inverter in which a PMOS transistor and an NMOS transistor are connected in series. However, the first through fourth driving units 521, 522, 523, and 524 may not be limited to the inverter described above, and may have any suitable structure.

Although only the four (first through fourth) driving units 521, 522, 523, and 524 for one of the four switching devices of the respective first through fourth switching units 531a, 532a, 533a, and 534a are illustrated in FIG. 9 for convenience of explanation, a total of sixteen driving units, one for each of the switching devices of the four switching units switching units 531a, 532a, 533a, and 534a, may be included.

As described above, the voltage conversion unit 53 may include the first through fourth voltage converters 531, 532, 533, and 534. Thus, the input voltage $V_{in}$ may be divided into levels, which are then respectively applied to the first through fourth voltage converters 531, 532, 533, and 534. In example embodiments, the levels may or may not be predetermined. However, example embodiments are not limited thereto. For example, the voltage conversion unit 53 may include at least two voltage converters.

In example embodiments, the first voltage converter 531 may include the first switching unit 531a and a first transformer T1. The first switching unit 531a may include the four switching devices M11, M12, M13, and M14, and four diodes D11, D12, D13, and D14. The second voltage converter 532 may include the second switching unit 532a and a second transformer T2. The second switching unit 532a may include the four switching devices M21, M22, M23, and M24, and four diodes D21, D22, D23, and D24. The third voltage converter 533 may include the third switching unit 533a and a third transformer T3. The third switching unit 533a may include the four switching devices M31, M32, M33, and M34, and four diodes D31, D32, D33, and D34. The fourth voltage converter 534 may include the fourth switching unit 534a and a fourth transformer T4. The fourth switching unit 534a may include the four switching devices M41, M42, M43, and M44, and four diodes D41, D42, D43, and D44.

As such, because the input voltage (Vin) (i.e., a DC-link voltage) may be divided into levels, the switching units 531a, 532a, 533a, and 534a, and the transformers T1, T2, T3, and T4 may be implemented as low-voltage devices. Thus, the individual devices may have a lower rated voltage and a lower resistance when turned on. As a result, the entire efficiency of the power device 5 may be improved.

In example embodiments, the switching devices of the first through fourth switching unit 531a, 532a, 533a, and 534a may be N-channel transistors each having a negative threshold voltage. Hereinafter, the operation of one of the switching devices of each of the first through fourth switching units 531a, 532a, 533a, and 534a will be described.

The first switching unit 531a may be connected between the first node N1 and the second node N2. Thus, the switching device M11 may be turned on when a difference between the driving voltage from the first driving unit 521 and the voltage of the second node N2 is greater than the threshold voltage, and may be turned off when the difference between the driving voltage and the voltage of the second node N2 is smaller than the threshold voltage. The first driving unit 521 may be connected between the first node N1 and the third node N3 and may provide the voltage of the first node N1 or the voltage of the third node N3 as the driving voltage. When the first driving unit 521 provides the voltage of the third node N3 as the driving voltage, the voltage of the third node N3 may be lower than the voltage of the second node N2, so that the switching device M11 may be turned off, and leakage current may be minimized or eliminated. The other switching devices M12, M13, and M14 of the first switching unit 531a may operate in a similar manner as described above.

The second switching unit 532a may be connected between the second node N2 and the fourth node N4. Thus, the switching device M23 may be turned on when a difference between the driving voltage from the second driving unit 522 and the voltage of the fourth node N4 is greater than the threshold voltage, and may be turned off when the difference between the driving voltage and the voltage of the fourth node N4 is smaller than the threshold voltage. The second driving unit 522 may be connected between the second node N2 and the fifth node N5 and may provide the voltage of the second node N2 or the voltage of the fifth node N5 as the driving voltage. When the second driving unit 522 provides the voltage of the fifth node N5 as the driving voltage, the voltage of the fifth node N5 may be lower than the voltage of the fourth node N4, so that the switching device M23 may be turned off, and leakage current may be minimized or eliminated. The other switching devices M21, M22, and M24 of the second switching unit 532a may operate in a similar manner as described above.

The third switching unit 533a may be connected between the fourth node N4 and the sixth node N6. Thus, the switching device M33 may be turned on when a difference between the driving voltage from the third driving unit 523 and the voltage of the sixth node N6 is greater than the threshold voltage, and may be turned off when the difference between the driving voltage and the voltage of the sixth node N6 is smaller than the threshold voltage. The third driving unit 523 may be connected between the fourth node N4 and the seventh node N7 and may provide the voltage of the fourth node N4 or the voltage of the seventh node N7 as the driving voltage. When the third driving unit 523 provides the voltage of the seventh node N7 as the driving voltage, the voltage of the seventh node N7 may be lower than the voltage of the sixth node N6, so that the switching device M23 may be turned off, and leakage current may be minimized or eliminated. The other switching devices M31, M32, and M34 of the third switching unit 533a may operate in a similar manner as described above.

The fourth switching unit 534a may be connected between the sixth node N6 and the eighth node N8. Thus, the switching device M43 may be turned on when a difference between the driving voltage from the fourth driving unit 524 and the voltage of the eighth node N8 is greater than the threshold voltage, and may be turned off when the difference between the driving voltage and the voltage of the eighth node N8 is smaller than the threshold voltage. The fourth driving unit 524 may be connected between the sixth node N6 and the ninth node N9 and may provide the voltage of the sixth node N6 or the voltage of the ninth node N9 as the driving voltage. When the fourth driving unit 524 provides the voltage of the ninth node N9 as the driving voltage, the voltage of the ninth node N9 may be lower than the voltage of the eighth node N8, so that the switching device M43 may be turned off, and leakage current does not occur. The other switching devices M41, M42, and M44 of the fourth switching unit 534a may operate in a similar manner as described above.

The first transformer T1 may convert the level of the power voltage switched by the first switching unit 531a to a voltage level that may or may not be predetermined. The second transformer T2 may convert the level of the power voltage switched by the second switching unit 532a to a voltage level that may or may not be predetermined. The third transformer T3 may convert the level of the power voltage switched by the third switching unit 533a to a voltage level that may or may not be predetermined. The fourth transformer T4 may convert the level of the power voltage switched by the fourth switching unit 541a to a voltage level that may or may not be predetermined. Thus, the voltage conversion unit 53 may provide the rectifying unit 54 with a total of the voltage levels output from the first through fourth transformers T1 through T4.

The rectifying unit 54 may rectify a converted voltage supplied from the voltage conversion unit 53 to generate an output voltage $V_{out}$. In example embodiments, the rectifying unit 54 may include four diodes 541, 542, 543, and 544, an inductor 545 and a capacitor 546. The four diodes 541, 542, 543, and 544 constitute a bridge diode circuit that full-wave rectifies the converted voltage supplied from the voltage conversion unit 43. The inductor 545 and the capacitor 546 constitute a low-pass filter that low-pass filters an output from the bridge diode circuit to provide a DC component with a minimal or reduced ripple as the output voltage $V_{out}$.

As described above, according to example embodiments, when a switching device has a negative threshold voltage, a driving unit for driving the switching device may be connected to a ground terminal, and the switching device may be connected to a node having a higher voltage level than the ground terminal, thereby providing an effect that a negative voltage is applied to the switching device when a ground voltage is applied to the driving unit. Thus, when a semiconductor device includes the switching device having a negative threshold voltage, an additional voltage generator for generating a negative voltage is not required. Thus, the semiconductor device may have a simpler circuit configuration and reduced power consumption.

In addition, because the switching device may be connected to the node having a higher voltage level than the threshold voltage, leakage current is minimized or eliminated when a ground voltage is applied to the driving unit.

It should be understood that example embodiments described therein should be considered in a descriptive sense only and not for purposes of limitation. Descriptions of features or aspects within example embodiments should typically be considered as available for other similar features or aspects in other embodiments.

What is claimed is:

1. A semiconductor device comprising:
   a switching device having a negative threshold voltage; and
   a driving unit between a power terminal and a ground terminal and providing a driving voltage for driving the switching device,
   wherein the switching device is connected to a virtual ground node having a virtual ground voltage that is greater than a ground voltage supplied from the ground terminal and is turned on when a difference between the driving voltage and the virtual ground voltage is greater than the negative threshold voltage.

2. The semiconductor device of claim 1, further comprising:
   a voltage dividing unit connected between the power terminal and the ground terminal, the voltage dividing unit including,
      at least one first passive device connected between the power terminal and the virtual ground node, and
      at least one second passive device connected between the virtual ground node and the ground terminal.

3. The semiconductor device of claim 1, wherein the virtual ground voltage is higher than the negative threshold voltage.

4. The semiconductor device of claim 1, wherein the switching device includes an N-channel transistor having a control terminal to which the driving voltage is applied, and an input terminal connected to the virtual ground node.

5. The semiconductor device of claim 1, further comprising:
a power unit connected between the power terminal and the ground terminal, the power unit including,
a first power source having a negative terminal connected to the ground terminal, and
at least one second power source connected between a positive terminal of the first power source and the power terminal.

6. The semiconductor device of claim 5, wherein the virtual ground node is connected to a negative terminal of the at least one second power source.

7. The semiconductor device of claim 5, wherein
the at least one second power source includes a plurality of second power sources, and
the virtual ground node is connected to a negative terminal of one of the plurality of second power sources.

8. The semiconductor device of claim 1, wherein the driving unit provides one of a power voltage supplied from the power terminal and the ground voltage supplied from the ground terminal as the driving voltage according to an external control signal.

9. The semiconductor device of claim 2, wherein at least one of the first and second passive devices includes a capacitor.

10. A semiconductor device comprising:
a switching device having a positive threshold voltage; and
a driving unit between a power terminal and a ground terminal and providing a driving voltage for driving the switching device,
wherein the switching device is connected to a virtual power node having a virtual power voltage that is lower than a power voltage supplied from the power terminal and is turned off when a difference between the driving voltage and the virtual power voltage is greater than the positive threshold voltage.

11. The semiconductor device of claim 10, wherein the virtual power voltage has a lower voltage than a difference between the power voltage and the positive threshold voltage.

12. The semiconductor device of claim 10, wherein the switching device comprises a P-channel transistor having a control terminal to which the driving voltage is applied, and an input terminal connected to the virtual power node.

13. A power device comprising:
a voltage dividing unit including at least two passive devices which are connected in series between a power terminal and ground terminal;
a voltage conversion unit including at least one switching device which is connected to a virtual ground node between the at least two passive devices and has a negative threshold voltage, and providing an output voltage having a different level from a level of the power voltage; and
a driving unit connected between the power terminal and the ground terminal and providing a driving voltage for driving the at least one switching device,
wherein the switching device is turned on when a difference between the driving voltage and a voltage of the virtual ground node is greater than the negative threshold voltage.

14. The power device of claim 13, wherein the voltage of the virtual ground node is greater than the negative threshold voltage.

15. The power device of claim 13, wherein the switching device comprises an N-channel transistor having a control terminal to which the driving voltage is applied, and an input terminal connected to the virtual ground node.

16. The power device of claim 13, further comprising:
a power unit connected between the power terminal and the ground terminal, the power unit including,
a first power source having a negative terminal connected to the ground terminal, and
at least one second power source connected between a positive terminal of the first power source and the power terminal,
wherein the virtual ground node is connected to a negative terminal of the at least one second power source.

17. The power device of claim 13, wherein the voltage conversion unit includes,
a switching unit including four switching devices connected between the power terminal and the virtual ground node and constitute a full-bridge circuit, and
a transformer that converts a level of a voltage output from the switching unit to a preset level.

18. The power device of claim 13, wherein the voltage dividing unit includes,
a first passive device connected between the power terminal and a first node,
a second passive device connected between the first node and a second node,
a third passive device connected between the second node and a third node, and
a fourth passive device connected between the third node and the ground terminal.

19. The power device of claim 18, wherein the voltage conversion unit includes,
a first voltage conversion unit comprising at least one first switching device connected between the power terminal and the first node, and
a second voltage conversion unit comprising at least one second switching device connected between the first node and the third node,
wherein a voltage between the first node and the second node has a higher level than a level of a threshold voltage of the at least one switching device, and a voltage of the third node has a higher level than a level of a threshold voltage of the at least one second switching device.

20. The power device of claim 19, wherein the driving unit includes,
a first driving unit connected between the power terminal and the second node and providing a first driving voltage for driving the at least one first switching device, and
a second driving unit connected between the first node and the ground terminal and providing a second driving voltage for driving the at least one second switching device.

* * * * *